United States Patent
Thompson et al.

(10) Patent No.: US 6,788,563 B2
(45) Date of Patent: Sep. 7, 2004

(54) SENSING DEVICE FOR A PASSIVE MATRIX MEMORY AND A READ METHOD FOR USE THEREWITH

(75) Inventors: Michael Thompson, Ithaca, NY (US); Richard Womack, Albuquerque, NM (US)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/088,096

(22) PCT Filed: Aug. 24, 2001

(86) PCT No.: PCT/NO01/00347

§ 371 (c)(1), (2), (4) Date: Jul. 2, 2002

(87) PCT Pub. No.: WO02/17322

PCT Pub. Date: Feb. 28, 2002

(65) Prior Publication Data

US 2002/0172069 A1 Nov. 21, 2002

(30) Foreign Application Priority Data

Aug. 24, 2000 (NO) .......................................... 2000 4237

(51) Int. Cl.$^7$ ............................................... G11C 11/22
(52) U.S. Cl. ................... 365/145; 365/149; 365/189.07; 365/207
(58) Field of Search ................................ 365/145, 149, 365/189.07, 207

(56) References Cited

U.S. PATENT DOCUMENTS

| | | | |
|---|---|---|---|
| 3,579,208 A | 5/1971 | Barlett | 340/173.2 |
| 4,839,643 A * | 6/1989 | Koenig et al. | 340/825.91 |
| 4,858,195 A | 8/1989 | Soneda | 365/205 |
| 5,086,412 A * | 2/1992 | Jaffe et al. | 365/145 |
| 5,218,566 A * | 6/1993 | Papaliolios | 365/145 |
| 5,262,982 A | 11/1993 | Brassington et al. | 365/145 |
| 5,905,671 A | 5/1999 | DeVilbiss | 365/145 |
| 6,124,819 A * | 9/2000 | Zhou et al. | 341/155 |
| 6,219,273 B1 * | 4/2001 | Katti et al. | 365/158 |
| 6,282,120 B1 * | 8/2001 | Cernea et al. | 365/185.21 |
| 6,288,934 B1 * | 9/2001 | Aikawa | 365/185.03 |
| 6,522,568 B1 * | 2/2003 | Nair | 365/145 |
| 6,529,398 B1 * | 3/2003 | Nair et al. | 365/145 |

FOREIGN PATENT DOCUMENTS

| | | |
|---|---|---|
| EP | 0486 901 A2 | 5/1992 |
| GB | 2 326 496 | 12/1998 |
| JP | 9-91970 | 4/1997 |

* cited by examiner

Primary Examiner—Connie C. Yoha
(74) Attorney, Agent, or Firm—Jacobson Holman PLLC

(57) ABSTRACT

A sensing device for reading data stored in a passive matrix memory including memory cells in the form of ferroelectric capacitors, includes an integrator circuit for sensing the current response and a device for storing and comparing two consecutive read values, one of which is a reference value. In a read method for use with the sensing device a bit line is connected to the sensing device for sensing a charge flowing therebetween and a memory cell at the crossing of the former and activated word line, whereafter two consecutive reads of the memory cell are performed and integrated over predetermined time periods in order to generate first and second read values which are compared for determining a logical value dependent on the sensed charge.

9 Claims, 3 Drawing Sheets

Figure 1:
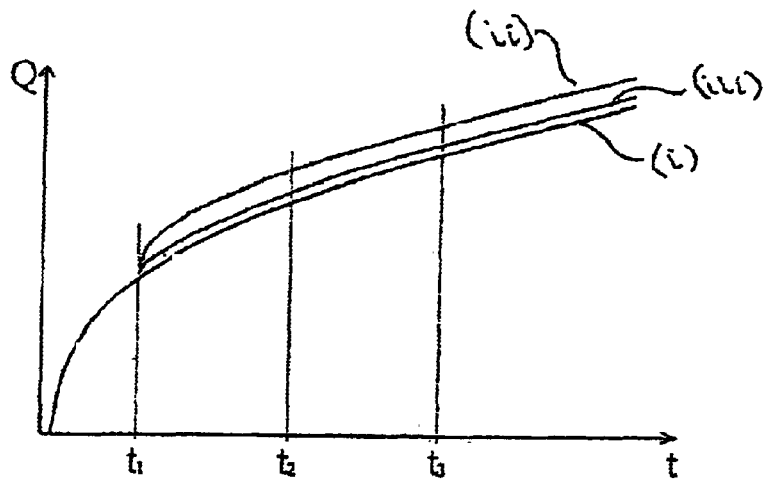

SENSING DEVICE FOR A PASSIVE MATRIX MEMORY AND A READ METHOD FOR USE THEREWITH

This application use the PCT/NO01/00347 of which filed on Aug. 24, 2001.

The invention concerns a sensing device for reading data stored in a passive matrix memory comprising memory cells in the form of ferroelectric capacitors, wherein said sensing device senses a current response corresponding to the data, typically a binary one or a binary zero, and performs an integration of two read values.

The invention also concerns a read method for use with the sensing device according to the invention, wherein the sensing device are used for reading data stored in a passive matrix memory with word and bit lines and comprising memory cells in the form of ferroelectric capacitors at crossings between the word and bit lines, wherein the sensing device senses a current response corresponding to the data stored in a memory cell, typically at binary one or a binary zero, and performs an integration of read values, wherein the read method comprises controlling the electric potentials on all word and bit lines in time latching word line potentials to potentials selected among predetermined word line potentials and either latching bit lines to potentials selected among predetermined bit line potentials, wherein bit lines in a read cycle are connected to the sensing device for sensing a charge flowing between a selected bit line and a memory cell at the crossing of the former and a word line activated by being latched to a selected potential for initializing the read cycle.

Ferroelectric matrix memories can be divided into two types, one type containing active elements linked to the memory cells, and one type without active elements. In the following focus is directed only towards passive matrix memories without active elements, such as diodes or transistors that are locally associated to the memory cells.

A ferroelectric matrix memory can have memory cells in the form of ferroelectric capacitors without active access elements such as an access transistor and comprises a thin ferroelectric material with a set of parallel conducting electrodes ("word lines") deposited on one side and an essentially orthogonal set of conducting electrodes ("bit lines") deposited on the other side. This configuration is referred to as a "passive matrix memory". In the passive matrix memory, the individual memory cells are formed at the crossing-points of the opposing electrodes creating a memory matrix comprising memory cells that can be individually accessed electrically by selective excitation of the appropriate electrodes from the edge of the matrix.

To write to a memory cell, a positive or negative voltage is applied to the electrodes, causing the ferroelectric material to move along its hysteresis curve to a stable state corresponding to the written datum, a binary one or a binary zero. To determine the data thus stored in a ferroelectric capacitor, a voltage (typically in the form of a voltage pulse) is applied across the plates of the capacitor, whereby a current response is sensed by means of a sensing device, typically a sense amplifier. The sensing device is typically connected to a respective bit line, directly or via a multiplexer or gate.

One of the difficulties during sensing is to establish a reference being able to discriminate between a binary zero and a binary one. One solution is to introduce a reference voltage to the sense amplifier, which is described for instance in U.S. Pat. No. 5,905,671. Any observed signal above the reference is taken as one of two logic states, while any signal below the reference is taken as the other logic state.

However, there are several limits and drawbacks with the described reference method and similar direct reference methods, which will be further described below.

Assuming stable and predictable conditions, a parasitic contribution may in principle be removed by subtracting a fixed amount of charge from that recorded by the sense amplifier during the reading cycle. In many instances, however, the magnitude and variability of the parasitic contribution makes this inappropriate. Thus, in addition to the manufacturing tolerances for the device, the fatigue and imprint history may vary within wide limits between different cells in the same memory device and even on the same bit line, and the parasitic current may depend strongly upon the device temperature at the time of readout. In addition, the parasitic current associated with a given non-addressed cell on the active bit line may depend on the actual logic state of this cell. In that case the cumulative parasitic current from all non-addressed cells on the active bit line depend on the set of data stored in those cells, which then must define prediction. Thus, there are many drawbacks using a direct reference.

Reference levels can also be obtained from neighbouring cells to deal with the problems indicated above. The neighbouring cells are believed to have the same conditions as the read cells. However, this is not always true, giving rise to problems.

Another implementation is to have a single current integrator providing the signal level corresponding to a known polarization change. A non-unity gain amplifier then distributes this potential as the reference level to a number of sense amplifiers.

All of the above-described methods of obtaining a reference share the problem of non-predictable conditions, whereby there still is a need of another solution for obtaining a true reference.

Hence it is a primary object of the invention to improve referencing of the sensing device, whereby the sensing device becomes resistant to noise and other interfering background signals. Another object of the invention is to provide a sense amplifier, which is not influenced by cumulative signals from non-addressed cells during reading of stored data, obtained i.e. in a so-called "partial word read". Finally, there is also an object of the invention to provide a read method for use with a sensing device of this kind.

The above-mentioned objects as well as other features and advantages are realized according to the present invention with a sensing device, which is characterized in that the sensing device comprises an integrator circuit for sensing the current response and means for storing and comparing two consecutive read values, one of which is a reference value.

In an advantageous embodiment of the sensing device according to the invention the integrator circuit comprises an operational amplifier and a capacitor connected between an inverting input of the operational amplifier and the output thereof. Preferably the integrator circuit then comprises a switch connected in parallel over the capacitor.

In an advantageous embodiment of the sensing device according to the invention the means for two consecutive reads comprises a first sample/hold circuit for sampling/storing a first read value, a second sample/hold circuit for sampling/storing a second read value, and a comparator circuit connected to the outputs of the sample/hold circuits for determining the state of an addressed memory cell.

Preferably the sample/hold circuits then can comprise capacitors and preferably can the comparator circuit be an operational amplifier.

Finally, a correction circuit can be connected between the second sample/hold circuit and the output of the integrator circuit.

The above-mentioned objects as well as other features and advantages are also realized according to the present invention with a read method which is characterized by two consecutive reads of a memory cell, integrating each read over a predetermined time period respectively to generate a first and a second read value, storing said read values, comparing the stored read values, and determining a logical value dependent on the sensed charge.

In an advantageous embodiment of the read method according to the invention a time delay is introduced between two consecutive reads in a read cycle.

The invention will now be explained in more detail in conjunction with the appended drawing figures, wherein FIG. 1 shows the principle of dual read as used in the invention, FIG. 2 the principle shown in FIG. 1 in more detail, FIG. 3a a generalized circuit diagram of a sensing device according to the invention, FIG. 3b a variant circuit diagram of the sensing device in FIG. 3a, and FIG. 4 a circuit diagram of a sensing device with dual read according to a preferred embodiment of the invention.

The invention implements a dual read which can be performed according to two principal schemes, termed (I) and (II) below.

(I) Dual read by means of a "single read" comprising a dual sensing operation, whereby word line WL is pulsed high once after a long bit line settling time followed by two successive reads (integrations).

(II) Dual read whereby a second read is subtracted from a first read to determine a stored value. The advantage is that common offsets/mismatches are removed. The word line WL is pulsed twice and sensing is performed during each time the word line WL is high.

The dual read method has the purpose of reducing the effect of the background current and also provide a self-reference on a particular bit line. In FIG. 1 an integrated charge versus time graph is shown. The difference in magnitude of the background currents and the charge emanating from the active cell is curve (i) as illustrated. Curve (ii) represents a logical "1" stored in the cell and curve (iii) a logical "0". In this particular example a first read is performed between a first time point $t_1$ and a second time point $t_2$ and a second read between the second time point $t_2$ and a third time point $t_3$.

Figure 2:
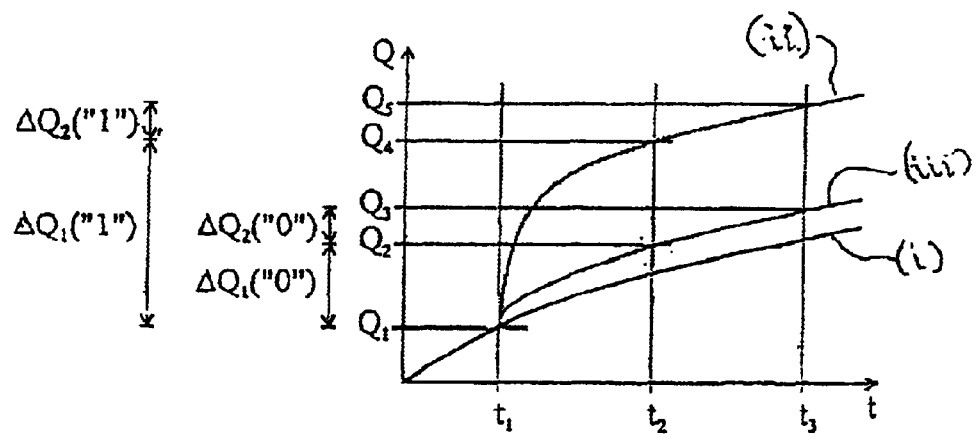

A more detailed relationship between the sensed charges can be seen in FIG. 2. Assuming an active cell containing a "1" during the first read between the first time point t1 and the second time point t2, first a read value $\Delta Q_1("1")=Q_4-Q_1$ is sensed, and during the second read between the second time point t2 and the third time point t3, a second read value $\Delta Q_2("1")=Q_5-Q_4$ is sensed in a similar manner. The first read value is stored in a first sample/hold circuit and the second read in a second sample/hold circuit, as will be mentioned below. These can for instance comprise a capacitor as charge storage element. Other charge storage elements are of course also possible. This will be described below in connection with a discussion of embodiments of the sensing device according to the invention.

In the same way for an active cell containing a "0" one gets $\Delta Q_1("0")=Q_2-Q_1$ and $\Delta Q_2("0")=Q_3-Q_2$. But $\Delta Q_1$ will in this example be larger than $\Delta Q_2$ for both a "1" and "0". Therefore, one has to introduce a threshold level in order to distinguish a "0" from a "1".

Figure 3A:
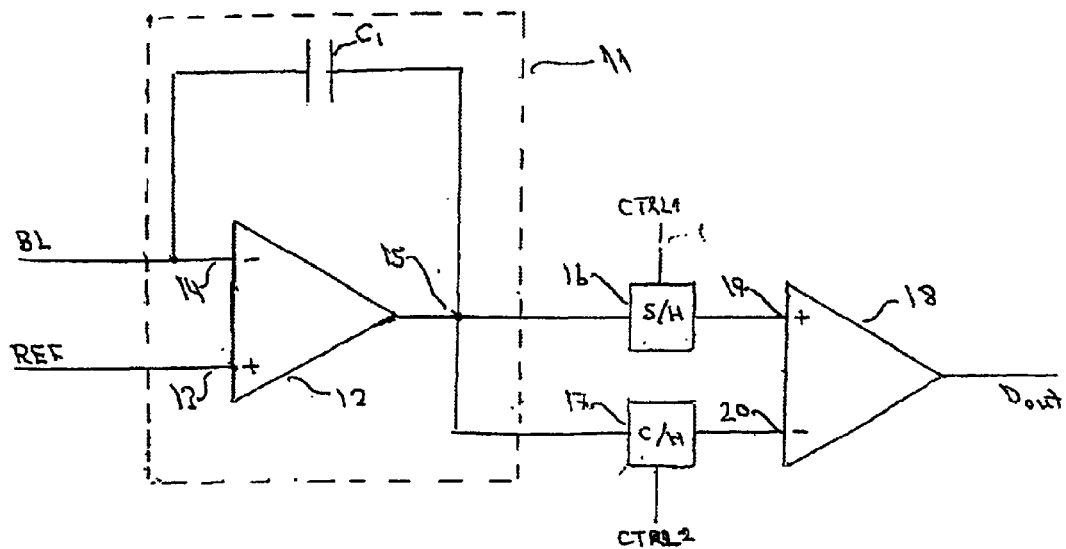
Figure 3B:
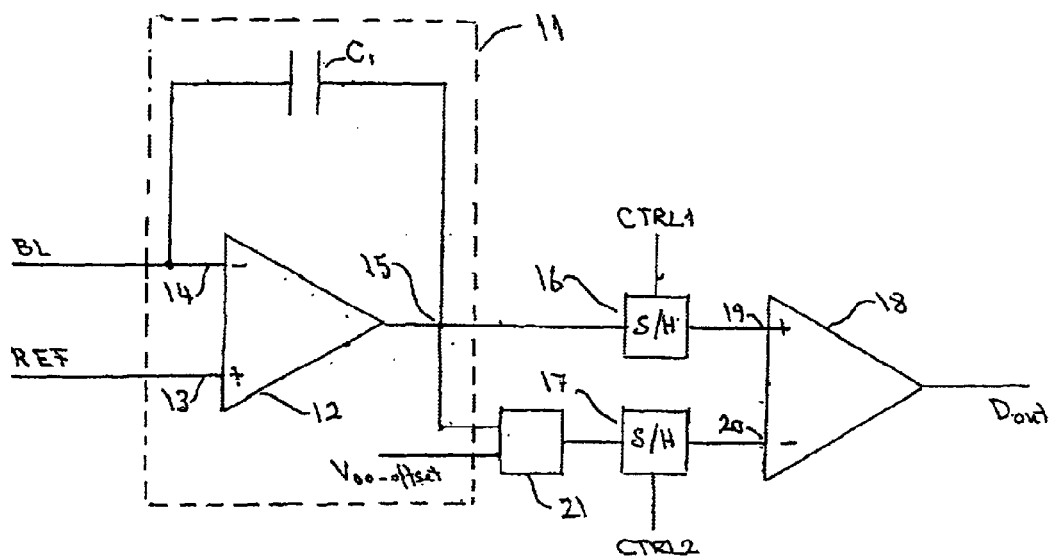

FIG. 3a shows schematically the principal functional components of a sensing device 10 according to the invention, providing dual read covering both the above-described principal sensing schemes (I) and (II). First a read, typically an integration of the current $I_{BL}$ on the bit line BL is performed by an integrator circuit 11 (inside the dashed line) comprising an integrating amplifier 12 with a non-inverting input 13 and an inverting input 14, and a feedback capacitor C1 connected in parallel between the non-inverting input 14 and the output of the amplifier 12. First and second read values output from the integrating circuit 11 are stored in first and second sample/hold circuits 16;17 respectively. Each sample/hold circuit 16;17 has an input for a control signal CTRL1; CTRL2. A comparator, preferably an operational amplifier 18 is connected with sample/hold circuit 16 via its non-inverting input 19 and via its inverting input with sample/hold circuit 17. The comparator compares two stored read values sensed in the dual read and generates the comparison as a data output signal on its output $D_{out}$.

If a hypothetical value, herein denoted $V_{00\text{-}offset}$ is introduced as the threshold level, one obtains the following conditions for the output.

$\Delta Q_1 - \Delta Q_2 > V_{00\text{-}offset}$, which is interpreted as a "1", and $\Delta Q_1 - \Delta Q_2 > V_{00\text{-}offset}$, which is interpreted as a "0".

In this way, the error introduced by the background current, the offset and process variation of the transistors in the integrating amplifier will manifest itself as a constant value in the $\Delta Q_1 - \Delta Q_2$ calculation. This error can be eliminated by adjusting the hypothetical value $V_{00\text{-}offset}$ in a correction circuit. FIG. 3b shows a variant embodiment of the device in FIG. 3a, but with the correction circuit 21 connected between the second sample/hold circuit 17 and the output 15 of the integrator circuit 11.

Figure 4:
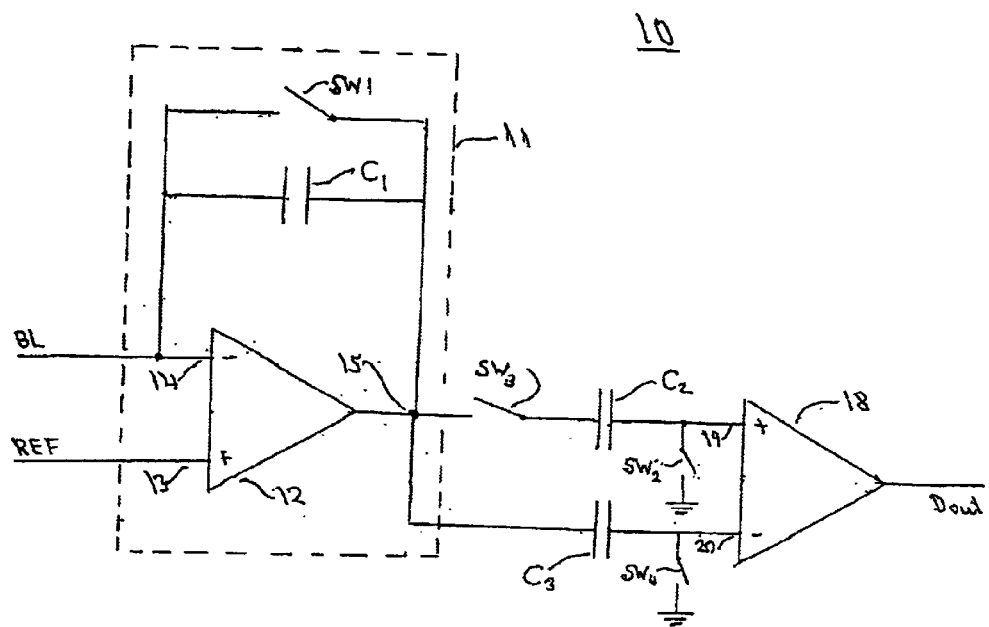

Now FIG. 4 illustrating a preferred embodiment of the invention shall be discussed. In this embodiment the sensing device 10 comprises an integrator circuit 11 (inside the dashed line) with an operational amplifier 12 having a non-inverting input 13, an inverting input 14, an output 15, and a feedback capacitor C1 connected between the output 15 and inverting input 14 of the operational (integrating) amplifier 12. In parallel to the feedback capacitor C1 there is provided a first switch SW1, which can be closed before sensing starts. The first switch SW1 is able to switch between at least two states, an open state and a closed state, of which the open state is shown.

The feedback capacitor C1 is initially shorted allowing the bit line BL to be charged to the non-inverting input's 13 potential through the output stage of operational amplifier 12. The bit line potential $V_{BL}$ will differ from a switching level $V_S$ by the input offset $V_{offset}$ of the operational amplifier 12. However, as long as the magnitude of the input offset voltage $V_{offset}$ is small compared to the total switching potential $V_s$ of a memory cell, it can be neglected. When the first switch SW1 opens, a small amount of charge will be injected onto the bit line BL from the capacitor C1 and must be cancelled in a comparator 18, which is connected to the output 15 of the integrator circuit 11. Subsequently current flowing to the bit line BL must also flow through the feedback capacitor C1, resulting in a potential shift of Q/C, where Q is the charge from the active memory cell to be read and C is the feedback capacitance. Since the potential on the bit line BL remains nearly constant, determined by the open loop gain of the operational amplifier 12, the total capacitance $C_{BL}$ of the bit line BL does not affect the observed signal level. The magnitude of the signal may also be established by judicious choice of the value of the feedback capacitor C1.

The output 15 of the integrator circuit 11 is AC-coupled to the comparator 18 via a capacitor C2, corresponding to the sample/hold circuit 16. To provide an absolute reference a switch SW2 is connected between ground and the output side of capacitor C2. In order to cancel out a transient from switch SW1, switch SW2 opens after the sensing by the integrator circuit 11 starts.

It is possible to develop a self-referencing algorithm based on sequential integration of a single bit line BL. In this two-stage sensing, the integrator circuit 11 provides a self-reference to cancel out leakage currents and other common mode noise on the bit line BL. As illustrated in FIG. 4, a third switch SW3 connected between the output 15 via the second capacitor C2 which operates as the sample/hold circuit 16 in FIG. 3a, and the non-inverting input of comparator 18, and a fourth switch SW4 connected between ground and the inverting input of comparator 18 are provided for this purpose. The upper side of the fourth switch SW4 is via a third capacitor C3 which operates as sample/hold circuit 17 in FIG. 3a connected to the output 15. During reset of the integrator circuit 11 comprising the operational amplifier 12, the first switch SW1, the second switch SW2, and the third and fourth switches SW3 and SW4 are closed. The first switch SW1 opens to start integration, followed by SW2 to latch the offset error introduced by opening the first switch SW1. After the first time period, the third switch SW3 is opened, isolating the first time period integration value (cf. the period between time points t2 and t1 in FIG. 2) on the second capacitor C2. The fourth switch SW4 is opened (possibly before the third switch SW3 opens) to begin integration during the second time period. Any leakage currents will appear as common mode signals to the inputs of the comparator 18 and thus cancel out, leaving only the charge differential arising from a polarization change. The periods of integration for the second and third capacitors C2 and C3 may be adjusted, as necessary, to establish appropriate margins for the comparator 18.

The addressing scheme for performing a read according to the invention using the inventive sensing device, shall now be described in some detail. During a read cycle the electric potentials on all word and bit lines are controlled in time according to a protocol or timing sequence whereby word line potentials are latched in a predetermined sequence to potentials selected among predetermined word line potentials, while bit lines are either latched in a predetermined sequence to potentials selected among predetermined bit line potentials or said bit lines are during a certain period of the timing sequence connected to circuitry that senses the charges flowing between the bit line(s) and the cells connecting to said bit line(s), two consecutive reads of said addressed cells are performed during the read cycle. The two read values obtained are stored in the sample/hold circuits and finally compared in the comparator of the sensing device.

Between said consecutive reads there may be a time or dwell delay. The result of an integration of the current sensed by means of the sensing device performed during the first of the two reads in a read cycle to determine the logic value of an addressed cell (to determine whether the cell contains a logic "0" or a logic "1"), is stored in the first sample/hold circuit. The read is always a destructive read ending up in a "0" and the memory cell must therefore be restored to its initial state (since a "1" or a "0" always ends up in a "0" because of the destructive read). The dwell delay is inserted to allow the material in the memory cell to return to a relaxed condition. The second read is executed using an identical pulsing and sensing protocol as the one used during the first read. The result of the second read is evaluated in the same way as the first read and stored in the second sample/hold circuit. The values stored in the first and second sample/hold circuits are then transferred to the comparator for determining the state of the addressed cell. Since the consecutive reads expose the bit lines to the same conditions in both cases, the offset currents are almost cancelled. The use of the same sensing device, typically the same integrating amplifier similarly, eliminates the concern over matching of circuit parameters and component values.

The dual read particularly addresses a wide number of potential problems in ferroelectric memories with a polymer memory material. First, the comparison can be established with a margin close to zero. Consequently, in a fatigued memory cell where the charge is released at a lower level and occurs slower, the sensing device will still distinguish the state since the total charge released in a first time period is greater than that released in a subsequent (equivalent) time period. There is no need for a-priori knowledge of the level of fatigue to properly sense the memory cell value. Similarly, following imprint, the absolute magnitude of the charge released in any given first time period is reduced due to the shift in the coercive field, but the relative value is still ordered. Again, the state of the memory cell can be determined with the dual read without knowledge of the imprint magnitude.

In an alternative embodiment of the invention it is possible to use a pre-read cycle immediately preceding the readout cycle and differing from the latter in only one respect, namely that the active word line is not shifted at all. The sensing device is then activated in precisely the same time slot relative to the bit line voltage shifts as is the case in the subsequent read cycle. Thus, the cumulative charge detected during the pre-read cycle shall correspond very closely to the parasitic current contributions captured during the read cycle, including contributions from the active cell. The detected charge from the pre-read cycle is stored and subtracted from that recorded during the read cycle, yielding the desired net charge from the switching or non-switching transient in the active memory cell.

What is claimed is:

1. A sensing device for reading data stored in a passive matrix memory comprising memory cells in the form of ferroelectric capacitors, wherein said sensing device senses a current response corresponding to the data including a binary one or a binary zero, end performs an integration of two read values, the sensing device comprises an integrator circuit for sensing the current response as an integration of charge as a function of time in consecutive timing intervals and means for storing and comparing two consecutively read values of the current response, one of which is a reference value.

2. A sensing device according to claim 1, wherein the means for two consecutive reads comprises a first sample/hold circuit for sampling/storing a first read value, a second sample/hold circuit for sampling/storing a second read value, and a comparator circuit connected to the outputs of the sample/hold circuits for determining the state of an addressed memory cell.

3. A sensing device according to claim 2, wherein the sample/hold circuits comprise capacitors.

4. A sensing device according to claim 2, wherein the comparator circuit is an operational amplifier.

5. A read method for use with the sensing device according to claim 1, wherein the sensing device are used for reading data stored in a passive matrix memory with word and bit lines and comprising memory cells in the form of ferroelectric capacitors at crossings between the word and bit lines, wherein the sensing device senses a current response corresponding to the data stored in a memory cell, typically at binary one or a binary zero, and performs an integration of read values, wherein the read method comprises controlling the electric potentials on all word and bit lines in time latching word line potentials to potentials selected among predetermined word line potentials and either latching bit lines to potentials selected among predetermined bit line potentials, wherein bit lines in a read cycle are connected to the sensing device for sensing a charge flowing between a selected bit line and a memory cell at the crossing of the former and a word line activated by being latched to a selected potential for initializing the read cycle, characterized by performing two consecutive reads of a memory cell, integrating each read over a predetermined time period respectively to generate a first and a second read value, storing said read values, comparing the stored read values, and determining a logical value dependent on the sensed charge.

6. A read method according to claim 5, characterized by introducing a time delay between two consecutive reads in a read cycle.

7. A sensing device for reading data stored in a passive matrix memory comprising memory cells in the form of ferroelectric capacitors, wherein said sensing device senses a current response corresponding to the data including a binary one or a binary zero, and performs an integration of two read values, the sensing device comprises an integrator circuit for sensing the current response and means for storing and comparing two consecutive read values, one of which is a reference value, the means for two consecutive reads comprises a first sample/hold circuit for sampling/storing a first read value, a second sample/hold circuit for sampling/storing a second read value, and comparator circuit connected to the outputs of the sample/hold circuits for determining the state of an addressed memory cell, a correction circuit being connected between the second sample/hold circuit and the output of the integrator circuit.

8. A sensing device for reading data stored in a passive matrix memory comprising memory cells in the form of ferroelectric capacitors, wherein said sensing device senses a current response corresponding to the data including a binary one or a binary zero, and performs an integration of two read values, the sensing device comprises an integrator circuit for sensing the current response as an integration of charge as a function of time in consecutive timing intervals and means for storing and comparing two consecutively read values of the current response, one of which is a reference value, and the integrator circuit comprises an operational amplifier and a capacitor connected between an inverting input of the operational amplifier and the output thereof.

9. A sensing device according to claim 8, wherein the integrator circuit comprises a switch connected in parallel over the capacitor.

* * * * *